United States Patent [19]
Wada et al.

[11] Patent Number: 5,149,683
[45] Date of Patent: Sep. 22, 1992

[54] METHOD FOR PRODUCING OXIDE SUPERCONDUCTOR

[75] Inventors: Takahiro Wada; Nobuo Suzuki; Ataru Ichinose; Yuji Yaegashi; Hisao Yamauchi; Shoji Tanaka, all of Tokyo

[73] Assignees: Matsushita Electric Industrial Co., Ltd., Osaka; The Tokyo Electric Power Co., Inc.; Central Research Institute of Electric Power Industry, both of Tokyo; Tohoku Electric Power Co., Inc., Miyagi; International Superconductivity Technology Center, Tokyo, all of Japan

[21] Appl. No.: 659,637

[22] Filed: Feb. 11, 1991

[30] Foreign Application Priority Data

Feb. 19, 1990 [JP] Japan .................. 2-038085

[51] Int. Cl.$^5$ ............... H01B 12/06; C01G 3/00; C04B 41/89; H01L 39/12
[52] U.S. Cl. ................... 505/1; 505/780; 505/779; 252/520; 501/123; 501/152
[58] Field of Search ............. 505/780, 779

[56] References Cited

FOREIGN PATENT DOCUMENTS 8805604 7/1988 PCT Int'l Appl. .

OTHER PUBLICATIONS

"Eight New High-temperature Superconductors with the 1:2:4 Structure", Morris et al, Physical Review B, vol. 39, No. 10, pp. 7347-7350.
Miyatake et al, "$T_c$ Increases to 90K in YBa$_2$Cu$_4$O$_8$ by Ca Doping", Nature, vol 341 pp. 41-42, Sep. 7, 1989.
Karpinski et al., "Bulk Synthesis of the 81K Superconductor YBa$_2$Cu$_4$O$_8$ at High Oxygen Pressure", Nature, vol. 336, Dec. 15, 1988, pp. 660-662.
Tsuchiya et al, "Effect of Doping Element on Superconductivity of YBa$_2$Cu$_3$O$_{7-8}$", Eplindid Abstracts, MRS High Temperature Superconductor Symposium, Apr. 5-9, 1988 pp. 311-313.
Wada et al, "Preparations and Properties of Superconducting Y(Ba$_{1-y}$Sr$_y$)$_2$Cu$_4$O$_8$", Phy. Rev. B. vol. 41 #6, Jun. 1, 1990.
R. G. Buckley, et al, "Calcium-Substituted Superconducting RBa2CU408 with Tc=90K Prepared at One Atmosphere", Physica C., vol. 165, No. 5/6, pp. 391-396, Feb. 1990.
S. Jin, et al, "Synthesis and Properties of the YBa2Cu408 Superconductor", Physica C., vol. 165, No. 5/6, pp. 415-418, Feb. 1990.

Primary Examiner—William R. Dixon, Jr.
Assistant Examiner—M. Bonner
Attorney, Agent, or Firm—Stevens, Davis, Miller & Mosher

[57] ABSTRACT

A method for producing an oxide superconductor formed according to a chemical composition formula $(R_{1-x}Ca_x)(Ba_{1-y}Sr_y)_2Cu_4O_8$ and having a transition temperature of 77K or above, comprising the step of causing a reaction between $(R_{1-x}Ca_x)(Ba_{1-y}Sr_y)_2Cu_3O_{7-z}$ and a Cu material such as CuO, wherein R stands for one or more rare earth elements selected from the group consisting of Y, Nd, Sm, Eu, Gd, Dy, Ho, Er, Tm and Yb, and wherein $0.01 \leq x \leq 0.25$, $0 \leq y \leq 0.5$, and $0 \leq z \leq 1$. The advantage of this production method is that this production method does not require a hot static pressing process which takes a long time.

3 Claims, 4 Drawing Sheets

METHOD FOR PRODUCING OXIDE SUPERCONDUCTOR

BACKGROUND OF THE INVENTION

This invention relates to a method for producing oxide superconductors, and more particularly to a method for producing oxide superconductors, the superconductivity transition temperature (hereafter referred to as Tc) of which is higher than the boiling point of liquid nitrogen (absolute temperature 77 K.).

As an oxide superconductor having a superconductivity transition temperature exceeding the boiling point of liquid nitrogen (e.g. Tc=80 K.), $RBa_2Cu_4O_8$ (R=Y, Nd, Sm, Eu, Gd, Dy, Ho, Er, or Tm) of a three-layer perovskite type crystal structure with double CuO chains is known [Phys. Rev. B., 38, 7347 (1989)]. The crystal structure of this superconductor has been determined as shown in FIG. 1. It is also known that Tc can be raised up to 90 K. by substituting Ca for a part of Y [Nature, 341, 41 (1989)]. Recently, the present inventor has found that an oxide superconductor substituted with Sr for a part of Ba in the above-mentioned oxide superconductor can have a lesser content of toxic Ba and yet keeps its superconductivity unchanged.

The oxide superconductor $(Y,Ca)Ba_2Cu_4O_8$, in which Ca has been substituted for a part of Y mentioned above, is conventionally produced by the following process. Material powders of the constituent elements are blended to have a predetermined element ratio, and the mixture is calcined and is subjected to a hot static pressing process for about ten hours in a mixed atmosphere of oxygen gas (20%) and argon gas (80%) at 2000 atm. Almost the same process was applied to the oxide superconductor containing Sr substituted for a part of Ba.

The hot static pressing process for a long time, necessary for the above-mentioned production method, is disadvantageous for use in mass production, and it makes oxide superconductors of this system expensive.

SUMMARY OF THE INVENTION

In order to eliminate the above mentioned disadvantageous process, the production method of the present invention for an oxide superconductor which is expressed by a chemical composition formula $(R_{1-x}Ca_x)(Ba_{1-y}Sr_y)_2Cu_4O_8$ is characterized most importantly by the step of causing an interaction between a material expressed by $(R_{1-x}Ca_x)(Ba_{1-y}Sr_y)_2Cu_3O_{7-z}$ and a Cu material.

The above-mentioned Cu material may consist of CuO. It ought to be noted that in the composition formula, R stands for one or more than one kind of rare earth elements selected from the group consisting of Y, Nd, Sm, Eu, Gd, Dy, Ho, Er, Tm and Yb, x is in the range from 0.001 to 0.25, y is in the range from 0 to 0.5, and z is in the range from 0 to 1.

According to the method of this invention, the hot static pressing process which takes a long time is not required, and therefore, oxide superconductors, which are expressed by the chemical composition formula $(R_{1-x}Ca_x)(Ba_{1-y}Sr_y)_2Cu_4O_8$, can be produced at low cost.

Samples taken from an oxide superconductor produced by this method, in which R is Y, x is 0.1 and y is 0, were found to have a superconductivity transition temperature of about 90 K. and exhibit substantially the same properties as those produced by the conventional production method. By thermogravimetric analysis, it was confirmed that the oxide superconductor of this invention exists stably with no absorption or discharge of oxygen up to about 900° C.

Therefore, oxide superconductors according to this invention do not impair their superconductivity through a sintering process in the final stage of the manufacturing process for a silver sheathed wire. For this reason, the superconductor made by this production method enables to produce a superconducting wire which is stable in superconductivity and which is sintered in high density.

DESCRIPTION OF THE PREFERRED EMBODIMENTS

Figure 1:
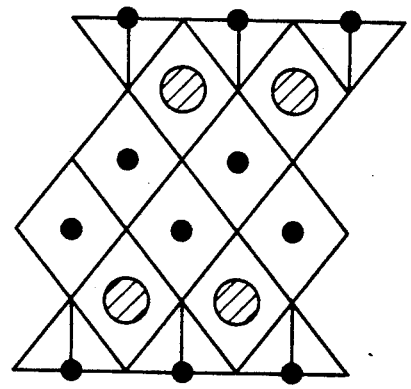
FIG. 1 is a diagram for explaining a crystal structure of $RBa_2Cu_4O_8$.
Figure 1:
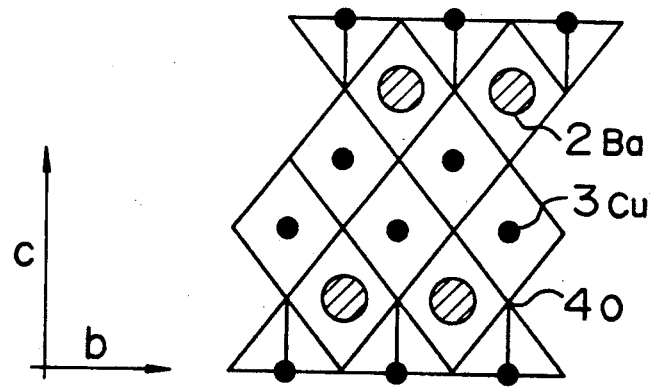

FIG. 1 shows a basic structure of $RBa_2Cu_4O_8$, which is the main component of an oxide superconductor according to this invention. In FIG. 1, reference numeral 1 indicates a rare earth element R, 2 indicates Ba, 3 indicates Cu, and 4 indicates O located at intersections of line segments. An oxide superconductor of $(R_{1-x}Ca_x)Ba_2Cu_4O_8$ system according to this invention is a compound derived from this basic structure by substituting Ca for at least a part of Y in this crystal structure having double CuO chains. $(R_{1-x}Ca_x)(Ba_{1-y}Sr_y)_2Cu_4O_8$ is a compound obtained by further substituting Sr for a part of Ba in this structure.

First Embodiment

Powders of $Y_2O_3$, $BaCO_3$, CuO, and $CaCO_3$ of 99.9% purity were mixed to produce mixtures of a chemical composition formula $(Y_{1-x}Ca_x)Ba_2Cu_3O_{7-z}$ so that x=0.01, 0.05, 0.1, 0.15, 0.2 and 0.25 respectively. Each of the mixtures was calcined in an atmosphere of oxygen for ten hours at 900° C. and 920° C. After calcination, a sample of the mixture was crushed and subjected to powder X-ray diffraction analysis. As a result, it was confirmed that $(Y_{1-x}Ca_x)Ba_2Cu_3O_{7-z}$ of substantially single phase was obtained in which $0 \leq z \leq 1$. After the amount of oxygen of this calcined powder was determined by iodometry, according to this value, CuO was mixed into the obtained material by such an amount that the component of the mixture becomes $(Y_{1-x}Ca_x)Ba_2Cu_4O_8$. After being sufficiently crushed and mixed by a planetary ball mill (using zirconia balls 1 mm in diameter), this mixed powder was formed into a rectangular shape. This formed body was sintered for 50 hours at 850° C. in an atmosphere of oxygen gas at 1 atm, then required samples were obtained.

Figure 2:
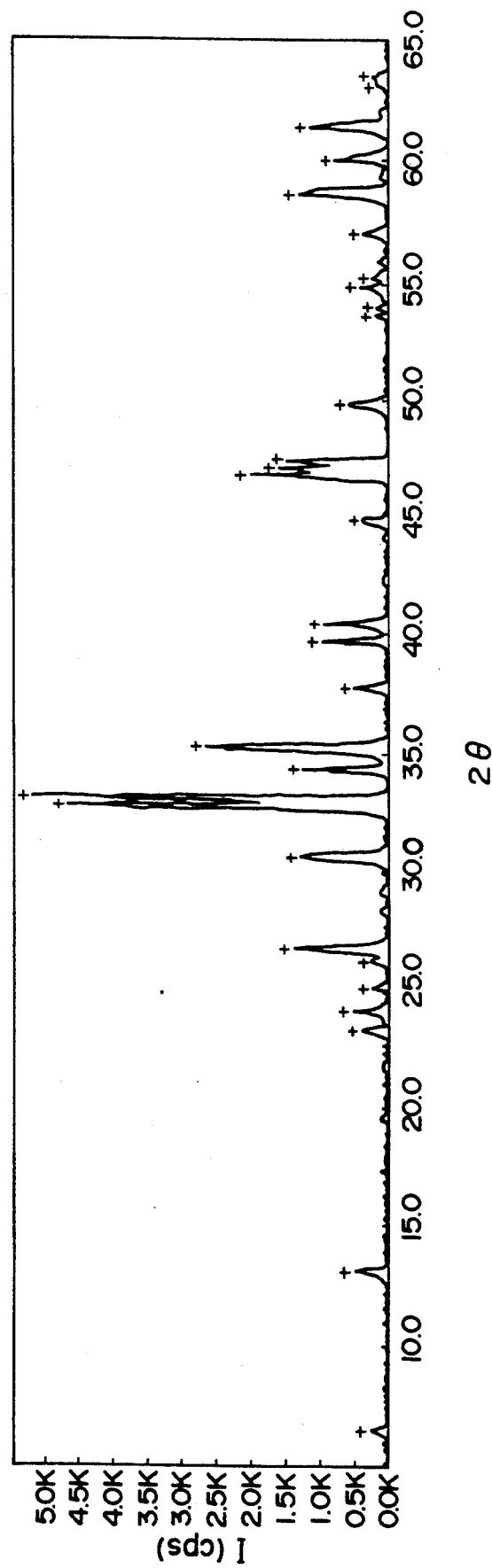
FIG. 2 is a powder X-ray diffraction diagram of a sample of a first embodiment of this invention, when R=Y and X=0.1.

By powder X-ray diffraction analysis of the crystal phase of the sintered body of $(Y_{1-x}Ca_x)Ba_2Cu_4O_8$ obtained as described above, it could be confirmed that the main components of the every obtained sample has the crystal structure of $YBa_2Cu_4O_8$ type. A powder X-ray diffraction diagram of a sample at x=0.10 is shown in FIG. 2. This sample had a single phase of the superconducting phase of $YBa_2Cu_4O_8$ type.

The superconductivity of those samples was examined by measuring the resistance. Results are shown in FIG. 3 and in Table 1.

TABLE 1

| Sample No. | Chemical composition R | x | y | Cu material | Crystal phase by X-ray diffraction | Tc |
|---|---|---|---|---|---|---|
| 1 | Y | 0.01 | 0 | CuO | $YBa_2Cu_4O_8$ type | 80 |
| 2 | Y | 0.05 | 0 | CuO | $YBa_2Cu_4O_8$ type | 87 |
| 3 | Y | 0.10 | 0 | CuO | $YBa_2Cu_4O_8$ type | 90 |
| 4 | Y | 0.15 | 0 | CuO | $YBa_2Cu_4O_8$ type | 91 |
| 5 | Y | 0.20 | 0 | CuO | $YBa_2Cu_4O_8$ type | 91 |
| 6 | Y | 0.25 | 0 | CuO | $YBa_2Cu_4O_8$ type | 90 |

Figure 3:
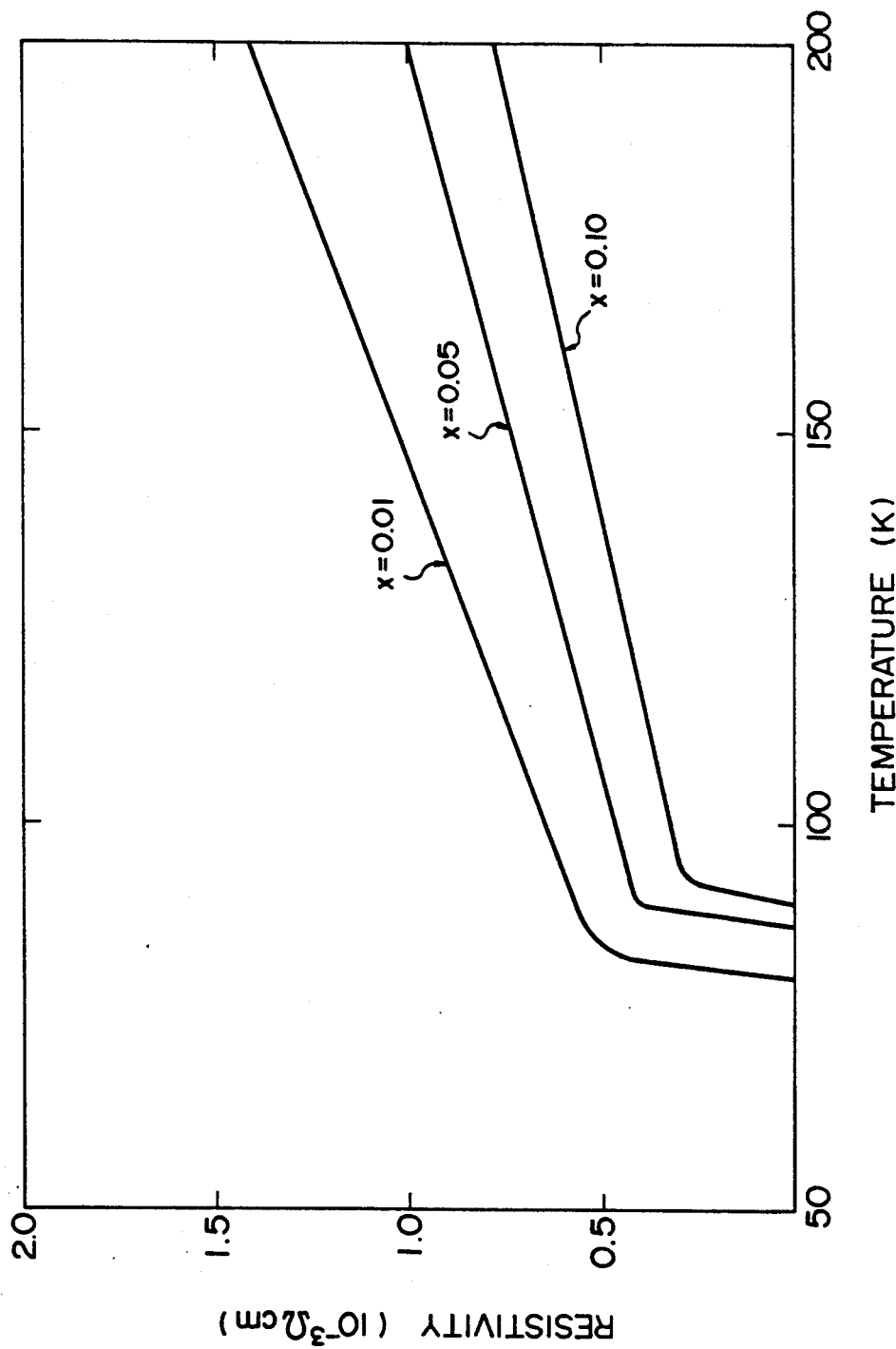
FIG. 3 is a resistance versus temperature characteristic diagram of $(Y_{1-x}Ca_x)Ba_2Cu_4O_8$.

FIG. 3 shows resistance—temperature characteristics of samples of x=0.01, 0.05 and 0.10. The Tc in Table 1 is the temperature when the resistivity is 0, obtained from the resistance—temperature characteristics. As evident from FIG. 3 and Table 1, each of oxide superconductor samples of a chemical composition of $(Y_{1-x}Ca_x)Ba_2Cu_4O_8$, made by the production method according to the first embodiment of this invention, exhibits 90 K.-class superconductivity transition temperature. This superconductivity transition temperature is higher than the boiling point of liquid nitrogen (77 K.).

Figure 4:
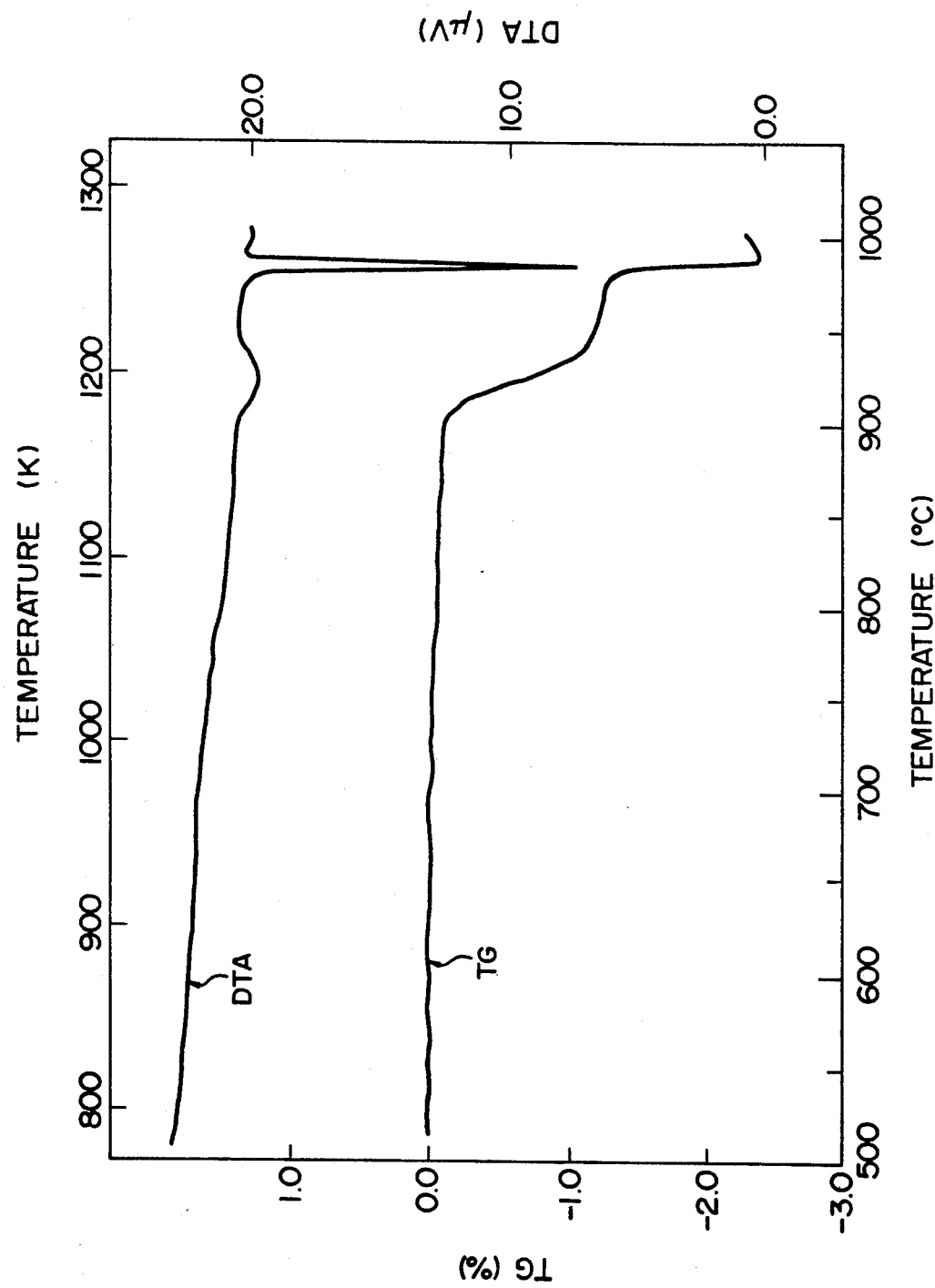
FIG. 4 is a diagram showing results of thermogravimetric analysis (TG) and differential thermal analysis (DTA) of a sample of the first embodiment of this invention, when R=Y and X=0.1.

FIG. 4 shows results of a thermogravimetric analysis (TG) and a differential thermal analysis (DTA) of a sample of x=0.1. In FIG. 4, TG(%) indicates the result of thermogravimetric analysis, while DTA($\mu$V) indicates the result of differential thermal analysis. In both analyses, measurements were performed while the samples were heated. As shown in FIG. 4, the samples did not show changes in weight from normal temperature up to the neighborhood of 900° C., but decreased in weight at 900° C. It was ascertained from these findings that the superconductivity exist in stable state without absorption or discharge of oxygen until the samples are heated to a high temperature as high as 900° C.

As described above, an oxide superconductor of chemical composition formula of $(Y_{1-x}Ca_x)Ba_2Cu_4O_8$, made by the production method of the first embodiment, was found to have properties with no difference from those of the samples made by the conventional hot static pressing process for a long time.

Second Embodiment

In a production method of an oxide superconductor according to a second embodiment of this invention, Nd, Sm, Eu, Gd, Dy, Ho, Er, Tm or Yb was substituted for the Y of $(Y_{1-x}Ca_x)Ba_2Cu_4O_8$, x was fixed at x=0.1, and samples were made by the same process as in the first embodiment. And, the samples were evaluated in the same respects as in the first embodiment mentioned above, and the evaluation results are shown in Table 2.

TABLE 2

| Sample No. | Chemical composition R | x | y | Cu material | Crystal phase by X-ray diffraction | Tc |
|---|---|---|---|---|---|---|
| 6 | Nd | 0.1 | 0 | CuO | $YBa_2Cu_4O_8$ type | 80 |
| 7 | Sm | 0.1 | 0 | CuO | $YBa_2Cu_4O_8$ type | 81 |
| 8 | Eu | 0.1 | 0 | CuO | $YBa_2Cu_4O_8$ type | 84 |
| 9 | Gd | 0.1 | 0 | CuO | $YBa_2Cu_4O_8$ type | 87 |
| 10 | Dy | 0.1 | 0 | CuO | $YBa_2Cu_4O_8$ type | 89 |
| 11 | Ho | 0.1 | 0 | CuO | $YBa_2Cu_4O_8$ type | 90 |

TABLE 2-continued

| Sample No. | Chemical composition R | x | y | Cu material | Crystal phase by X-ray diffraction | Tc |
|---|---|---|---|---|---|---|
| 12 | Er | 0.1 | 0 | CuO | $YBa_2Cu_4O_8$ type | 90 |
| 13 | Tm | 0.1 | 0 | CuO | $YBa_2Cu_4O_8$ type | 89 |
| 14 | Yb | 0.1 | 0 | CuO | $YBa_2Cu_4O_8$ type | 89 |

Consulting Table 2, substitution of any of Nd, Sm, Eu, Gd, Dy, Ho, Er, Tm and Yb for Y as the rare earth element R can achieve the same results as in the first embodiment mentioned above.

Third Embodiment

In the production method of an oxide superconductor according to a third embodiment of this invention, by having x of $(Y_{1-x}Ca_x)(Ba_{1-y}Sr_y)_2Cu_4O_8$ fixed at x=0.1, and y changed to 0.1, 0.2, 0.3, 0.4 and 0.5, samples were produced by the same process as in the first embodiment. The samples were evaluated in the same respects as in the first embodiment, and the evaluation results are presented in Table 3. From this table, it is understood that even if Sr is substituted for a part of Ba when y is in the range up to 0.5, the same results can be obtained as in the first embodiment.

TABLE 3

| Sample No. | Chemical composition R | x | y | Cu material | Crystal phase by X-ray diffraction | Tc |
|---|---|---|---|---|---|---|
| 15 | Y | 0.1 | 0.1 | CuO | $YBa_2Cu_4O_8$ type | 90 |
| 16 | Y | 0.1 | 0.2 | CuO | $YBa_2Cu_4O_8$ type | 90 |
| 17 | Y | 0.1 | 0.3 | CuO | $YBa_2Cu_4O_8$ type | 89 |
| 18 | Y | 0.1 | 0.4 | CuO | $YBa_2Cu_4O_8$ type | 89 |
| 19 | Y | 0.1 | 0.5 | CuO | $YBa_2Cu_4O_8$ type | 89 |

Fourth Embodiment

In the production method of an oxide superconductor according to a fourth embodiment of this invention, with x of $(Y_{1-x}Ca_x)Ba_2Cu_4O_8$ fixed at x=0.1 and by using $Cu_2O$ and Cu metallic powders separately, samples were made by the same process as in the first embodiment. The samples were evaluated in the same respects as in the first embodiment, and the results are shown in Table 4.

TABLE 4

| Sample No. | Chemical composition R | x | y | Cu material | Crystal phase by X-ray diffraction | Tc |
|---|---|---|---|---|---|---|
| 20 | Y | 0.1 | 0 | $Cu_2O$ | $YBa_2Cu_4O_8$ type | 90 |
| 21 | Y | 0.1 | 0 | Cu | $YBa_2Cu_4O_8$ type | 91 |

As evident from Table 4, by using $Cu_2O$ or Cu metallic powder is used as the Cu material instead of CuO, the same results as in the first embodiment can be obtained.

Fifth Embodiment

In a production method of an oxide superconductor according to a fifth embodiment of this invention, with regard to the chemical composition of $(R_{1-x}Ca_x)Ba_2Cu_4O_8$, x was fixed at x=0.1 and R was replaced with a mixture of 50 mol % of Y and 50 mol % of Ho, and samples were prepared by the same process. The samples were evaluated in the same respects as in the first embodiment. Powder X-ray diffraction analysis revealed that the samples have a single phase of $YBa_2Cu_4O_8$ type. Tc was found to be 90 K. From these findings, it was made evident that the same results can be achieved as in the first embodiment.

A sample for comparison was made by a production method, which will be described below.

Powders of $Y_2O_3$, $BaCO_3$, CuO and $CaCO_3$ of 99.9% purity were mixed to produce a mixture of a chemical composition formula $(Y_{1-x}Ca_x)Ba_2Cu_4O_8$ so that $x=0.1$, and the mixture was calcined in the atmosphere of oxygen at 850° C. for 20 hours. After calcined, the mixture was crushed, formed and then sintered at 850° C. for 50 hours in the atmosphere of oxygen at 1 atm, thus producing a required sample.

Powder X-ray diffraction analysis was performed on the sintered sample of a chemical composition formula $(Y_{0.9}Ca_{0.1})Ba_2Cu_4O_8$ to determine its crystal phase, and it was revealed that an intended phase with a crystal structure of $YB_2Cu_4O_8$ type was not formed at all.

As obvious from the above description, in the production methods of oxide superconductor according to the first to fifth embodiments, a hot static pressing process is not required, so that those production methods are advantageous in mass production and contribute to a reduction of cost.

Oxide superconductors produced by the methods according to the first to fifth embodiments of this invention have Tc higher than the boiling point of liquid nitrogen, and when made into silver sheathing wires, do not have their superconductivity lessened by the sintering process. Therefore, a superconducting wire stable in superconductivity can be produced relatively easily.

In addition, oxide superconductors made by the production methods according to the first to fifth embodiments can be formed into high-density products if a binder is used in high-temperature forming. From conventional oxide superconductors expressed by a chemical composition formula $RBa_2Cu_3O_7$, the binder cannot be removed at 400° C. or higher. On the other hand, from oxide superconductors made by the production methods according to the first to fifth embodiments, the binder can be removed at 900° C. or below, a fact which permits high-density forming, and improves a superconducting current density.

As has been described, according to the production methods of this invention, it is possible to provide oxide superconductors at low cost, which have a superconductivity transition temperature higher than the boiling point of liquid nitrogen expressed by a chemical composition formula $(R_{1-x}Ca_x)(Ba_{1-y}Sr_y)_2Cu_4O_8$ (R stands for a one or two or more kinds of rare earth elements selected from among Y, Nd, Sm, Eu, Gd, Dy, Ho, Er, and Tm) and which is stable with no absorption or discharge of oxygen up to high temperature.

This invention has been described with reference to the concrete embodiments. This invention is not limited to the embodiments mentioned above. Obviously, many modifications and variations of this invention are possible without departing from the spirit or scope of the invention.

For instance, needless to say, this invention can be used for low-temperature electronic apparatuses and their wiring or for electromagnetic shielding, etc.

We claim:

1. A method for producing an oxide superconductor expressed by a chemical composition formula of $(R_{1-x}Ca_x)(BA_{1-y}Sr_y)_2Cu_4O_8$, comprising reacting, by heating, a first material expressed by $(R_{1-x}Ca_x)(BA_{1-y}Sr_y)_2Cu_3O_{7-z}$ and a Cu material, wherein R stands for one or more rare earth elements selected from the group consisting of Y, Nd, Sm, Eu, Gd, Dy, Ho, Er, Tm, and Yb, and wherein $0.001 \leq x \leq 0.25$, $0 \leq y \leq 0.5$, and $0 \leq z \leq 1$.

2. The method according to claim 1, wherein said Cu material is CuO.

3. The method according to claim 1, wherein both said first material and said Cu material are in the form of a powder and said reacting step is carried out under conditions of temperature below 900° C. and partial pressure of oxygen not exceeding one atmosphere.

* * * * *